US 7,058,911 B2

United States Patent
Singh

(10) Patent No.: US 7,058,911 B2
(45) Date of Patent: Jun. 6, 2006

(54) MEASUREMENT OF TIMING SKEW BETWEEN TWO DIGITAL SIGNALS

(75) Inventor: Balwant Singh, Greater Noida (IN)

(73) Assignee: STMicroelectronics Pvt. Ltd., Uttar Pradesh (IN)

(*) Notice: Subject to any disclaimer, the term of this patent is extended or adjusted under 35 U.S.C. 154(b) by 440 days.

(21) Appl. No.: 10/321,297

(22) Filed: Dec. 17, 2002

(65) Prior Publication Data

US 2003/0117868 A1   Jun. 26, 2003

(30) Foreign Application Priority Data

Dec. 18, 2001   (IN)   ........................ 1255/Del/2001

(51) Int. Cl.
*G06F 17/50* (2006.01)
(52) U.S. Cl. ........................................................ 716/6
(58) Field of Classification Search ................ 716/6, 716/4
See application file for complete search history.

(56) References Cited

U.S. PATENT DOCUMENTS

| | | | | |
|---|---|---|---|---|
| 4,523,289 A | * | 6/1985 | Soma et al. ................. | 702/176 |
| 5,231,598 A | * | 7/1993 | Vlahos ........................ | 714/700 |
| 5,600,568 A | * | 2/1997 | Iwakura et al. ................ | 716/6 |
| 5,740,067 A | * | 4/1998 | Hathaway ....................... | 716/6 |
| 6,469,550 B1 | * | 10/2002 | Kurd ........................... | 327/141 |
| 6,750,692 B1 | * | 6/2004 | Jang ............................. | 327/291 |

* cited by examiner

*Primary Examiner*—Vuthe Siek
*Assistant Examiner*—Brandon Bowers
(74) *Attorney, Agent, or Firm*—Lisa K. Jorgenson; Allen, Dyer, Doppelt, Milbrath & Gilchrist, P.A.

(57) ABSTRACT

A system for measuring a timing skew between two digital signals may include a clock generator for generating a time measurement clock, and a pulse-to-digital converter for converting the timing skew into an equivalent digital coded value after correcting for internal logic delays. The system may further include a register bank for storing the digital coded values, and a controller for generating control signals and sequences for controlling the operation of the pulse-to-digital converter and the register bank.

36 Claims, 6 Drawing Sheets

MEASUREMENT OF TIMING SKEW BETWEEN TWO DIGITAL SIGNALS

FIELD OF THE INVENTION

The present invention relates to the field of electronic devices and, more particularly, to memories such as static random access memories (SRAMs), dynamic RAMs (DRAMs), read only memories (ROMs), and dynamic programmable logic arrays (PLAs), for example. Moreover, the invention relates to a method and system for measuring timing skew between two digital signals, such as for the measurement of an access time of a memory device.

BACKGROUND OF THE INVENTION

Perhaps the most critical timing requirement for any memory element is its access time. As device size continues to shrink, access time is also decreasing, and an accurate measurement of access time is becoming increasingly complex.

One conventional method for measuring access time is to measure the access time from an input pad to an output pad using an external tester and subtract out any extra path delay. Such a test configuration is illustratively shown in FIG. 1. The external tester measures the time interval between application of the input signals at the input pads and the sensing of the output signal at the output pad. This time interval may be defined as follows:

$$T\text{total}=T(\text{input pad})+T(\text{input glue interface})+Taa+T(\text{MUX})+T(\text{output glue interface})+T(\text{output pad}).$$

To extract the actual access time, the tester then switches the MUX to bypass the memory element and measures the time delay once again from the input pad to the output pad. This time interval is given by:

$$T\text{dummy}=T(\text{input pad})+T(\text{input glue interface})+T(\text{MUX})+T(\text{output glue interface})+T(\text{output pad}),$$

where Taa=(Ttotal−Tdummy), and Taa is the required access time.

The above-described prior art method suffers from several drawbacks. First, measurement of the read access time for zero (Read 0) is not advisable for positive clock triggered memories, and vice-versa. That is, this system is not accurate for a Read 0 measurement since at the time of Ttotal calculation for Read 0, blocks from the input pad to the memory clock input are transferring clock rising edges, whereas blocks from the memory output to the output pad are transferring the 1 to 0 transition. This can be represented as:

$$T\text{total}=Tr(\text{Input Pad})+Tr(\text{Input Core logic})+Taa+Tf(\text{Output Core logic})+Tf(\text{Output Pad}).$$

When Tdummy is calculated the full system is transferring the positive edge of the clock, thus:

$$T\text{dummy}=Tr(\text{Input pad})+Tr(\text{Input Core Logic})+Tr(\text{Output Core Logic})+Tr(\text{Output pad}); \text{ and}$$

$$Taa=T\text{total}-T\text{dummy}=\{Tr(\text{Input Pad})+Tr(\text{Input Core logic})+Taa+Tf(\text{Output Core logic})+Tf(\text{Output Pad})\}-\{Tr(\text{Input pad})+Tr(\text{Input Core Logic})+Tr(\text{Output Core Logic})+Tr(\text{Output pad})\}=Taa+\{Tf(\text{Output Core logic})+Tf(\text{Output Pad})-Tr(\text{Output Core Logic})+Tr(\text{Output pad})\},$$

where Tr=rise time and Tf fall time. Accordingly, the error in the Read 0 measurement of a positive edge triggered memory is:

$$\text{ERROR}=\{Tf(\text{Output Core logic})+Tf(\text{Output Pad})-Tr(\text{Output Core Logic})+Tr(\text{Output pad})\}.$$

Another disadvantage of the above-described prior art approach is that the test pattern is established through the automatic test equipment (ATE). This increases the time of testing for embedded systems and hence increases the per chip cost of the product. Furthermore, IMS/HP/Teradyne, etc. testers are generally used for applying the test pattern in this system. These testers have input pattern delivery error of ±150 ps and output sampling of ±150 ps. This error gets added to the total error of the system, which is ~±300 ps. Further still, the path mismatch between inputs A and B and the output of the multiplexer MUX introduces another potential source of inaccuracy.

SUMMARY OF THE INVENTION

An object of the present invention is to mitigate the above problems and provide a method and a system for accurate measurement of timing skew between two digital signals.

To achieve this objective, this invention provides a system for measurement of timing skew between two digital signals which may include a clock generator or means for generating a time measurement clock, and a pulse-to-digital-converter or means for converting the timing skew into an equivalent digital coded value after correcting for internal logic delays. The system may also include a register bank or means for storing the digital coded values, and a controller or means for generating control signals and sequences for controlling the operation of the pulse-to-digital converter and the register bank.

By way of example, the clock generator and register bank may be implemented using conventional components. Further, the pulse-to-digital converter may be a digital circuit including a converter or means for converting the timing skew between the two digital signals into a pulse, a counter or means gated by the pulse for counting clock pulses from the clock generation means, and a circuit or means for determining internal logic delays by operating the internal logic circuit as an oscillator and determining its period. Moreover, the pulse-to-digital converter may also include a circuit or means for correcting the counted clock pulses for the internal logic delay, and a circuit or means for converting the count into a specified digital coded output.

Also by way of example, the controller may be a finite state machine (FSM) that generates digital control signal patterns corresponding to the desired measurement conditions. The controller may also include a circuit or means for generating the two digital signals whose timing skew is to be measured.

The system may advantageously be integrated with a memory device and used for measuring its access time. In particular, the system may be used as a digital comparator in a phase locked loop (PLL), for example. The system may thus be used to selectively measure read access time for a logic 0 data value and read access time for a logic 1 data value, for example.

A method aspect of the invention is for measuring the timing skew between two digital signals and may include generating a timing clock, converting the timing skew into a pulse using a conversion circuit, and counting the clock pulses during the active state of the pulse. The method may further include determining internal delays introduced by the conversion to the pulse, correcting the count value for the timing delays introduced during conversion to the pulse, converting the corrected count value into a desired digital code, and storing the digital code value.

The internal delays may be determined by operating the conversion circuit as an oscillator, measuring the time period of the oscillator, and deriving the delay period from the measured time period. The method may also include generating the two digital signals whose skew is to be measured. The method may advantageously be used for measuring memory access time, as well as for digital comparison in a PLL.

BRIEF DESCRIPTION OF THE DRAWINGS

The invention will now be explained with reference to the accompanying drawings, in which.

DETAILED DESCRIPTION OF THE PREFERRED EMBODIMENTS

Figure 1:
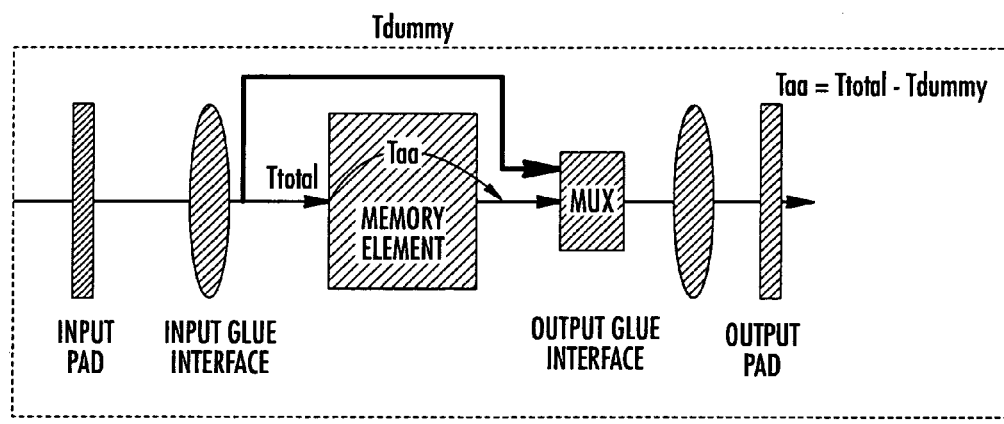
FIG. 1 is a schematic block diagram of a prior art measurement device for measuring the access time of a memory element.
Figure 2:
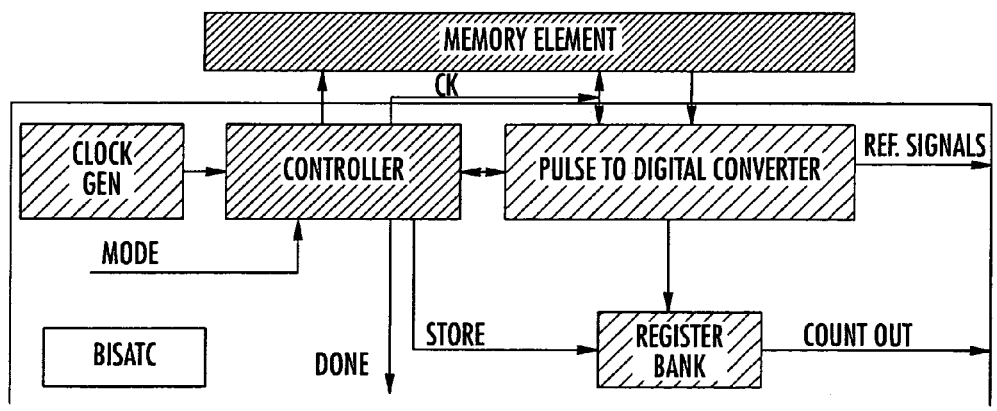
FIG. 2 is a schematic block diagram of a system for measuring timing skew in accordance with the present invention.

Turning now to FIG. 2, a schematic block diagram of the system according to the present invention is illustratively shown. The system is capable of measuring the access time of memories, on-chip, without any external tester interface. The system is also programmable for different types of access times to be measured.

TABLE 1

Different Access Times

| ACCESS Times | Definition |
|---|---|
| READ 0 | Read logic 0 access time |
| READ 1 | Read logic 1 access time |
| WRITE 0 | Write through logic 0 access time |
| WRITE 1 | Write through logic 1 access time |

The system can be programmed by a single pin mode as follows. If mode=0 the Read 0, Read 1 access times are measured and by default mode is kept at 0. If mode=1, then Read 0, Read 1, Write 0, Write 1 access times are measured.

The system illustratively includes the following blocks. The clock generator is used for generating the BISATC system clock. The controller generates patterns for testing the memory (i.e., clock, address, data, write and read enable) for a specific access time to be measured which is programmed before starting the system by the mode signal.

Furthermore, a pulse-to-digital converter converts the transition difference between the clock and the output Q of the memory into a equivalent pulse width, and this pulse width is converted into digital format (binary, gray, etc.). The type of transition on the output Q depends on the type of access time being measured. The type of transition expected on the output Q is controlled by the controller, and this information is also passed to the pulse-to-digital converter.

Additionally, a register bank is included for storing digital equivalent access times. The number of words needed in the register bank depends on the mode in which the system is going to work. If the system is operated in mode=0, then two words are preferably used. Otherwise, four words are preferably used. Further, another word may be used to store the internal delay inserted by the pulse-to-digital converter for measuring the access time, which will be subtracted from the total access time as a correction factor.

Figure 3:
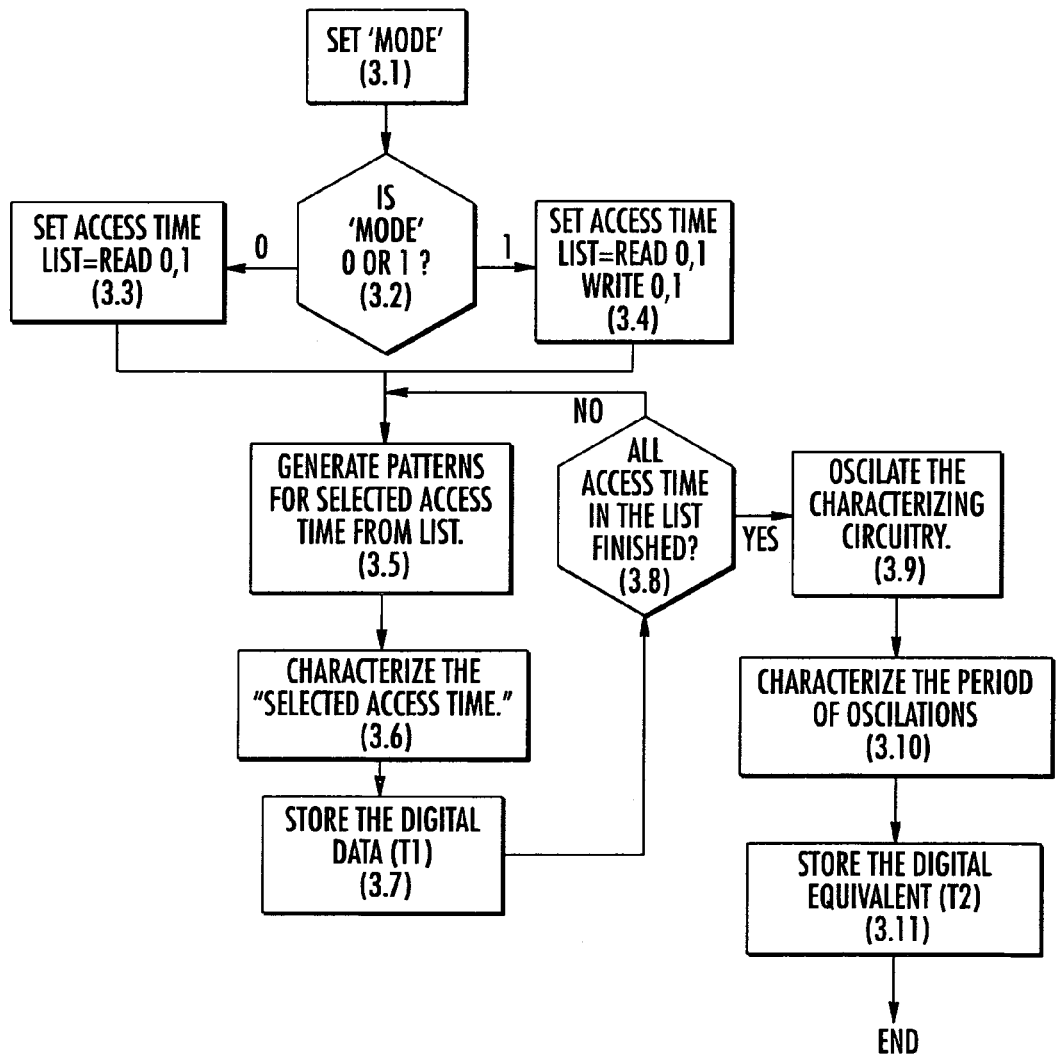
FIG. 3 is a flow diagram of a method in accordance with the present invention.

As illustratively shown in FIG. 3, the sequence of actions starts with setting of the mode (Block 3.1). The mode is then checked (Block 3.2). If the mode=0, then only read access for both 0 and 1 are to be determined (Block 3.3). If mode=1, then both read and write access times are to be measured (Block 3.4). The controller then generates the appropriate signal patterns (Block 3.5) and obtains one of the desired access times (Block 3.6). This access time is then stored (Block 3.7). The system then checks to see whether all access times have been measured (Block 3.8). If not, the sequence of pattern generation and measurement is repeated, else the measurement circuitry is converted into an oscillator (Block 3.9) and its oscillation period is measured (3.10) to determine its internal delays. The final corrected access time values are then converted and stored as final digital values (Block 3.11).

Figure 4:
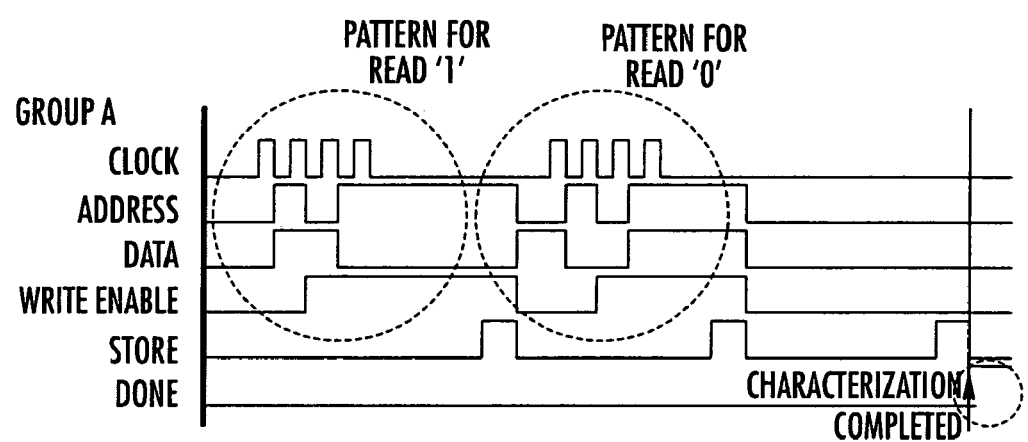
FIG. 4 is a waveform diagram illustrating simulation results for the controller of the system of FIG. 2.

Simulation results for the case in which mode 0 are illustrated in FIG. 4. In this simulation the controller's finite state machine (FSM) is memory dependent. It should be noted that a different FSM may be desirable for synchronous and asynchronous memories, for example. The FSM is responsible for generating patterns for different access times (see Table 1) of memory. This block is in feedback with the pulse-to-digital converter.

The FSM generates patterns for creating the environment for Read 1 access time and then enables the pulse-to-digital converter for measuring Read 1 access time. The pulse-to-digital converter does the measurement of Read 1 access time when the outputs of the FSM are stable. Once Read 1 access time is measured by the pulse-to-digital converter, it activates the FSM again, and the FSM generates a STORE signal for storing the digital data generated by the pulse-to-digital converter. This is repeated for Read 0 also, and the digital equivalent of Read 0 is stored at the rising edge of the STORE signal generated by the FSM. The FSM/controller generates a last cycle which is used for measuring the pulse-to-digital converter internal delay, which is subtracted from all the access times measured. Once all the measurement data is stored in the register bank, the FSM generates a DONE signal which shows that the measurement is completed and the data from the register bank can be read.

Figure 5:
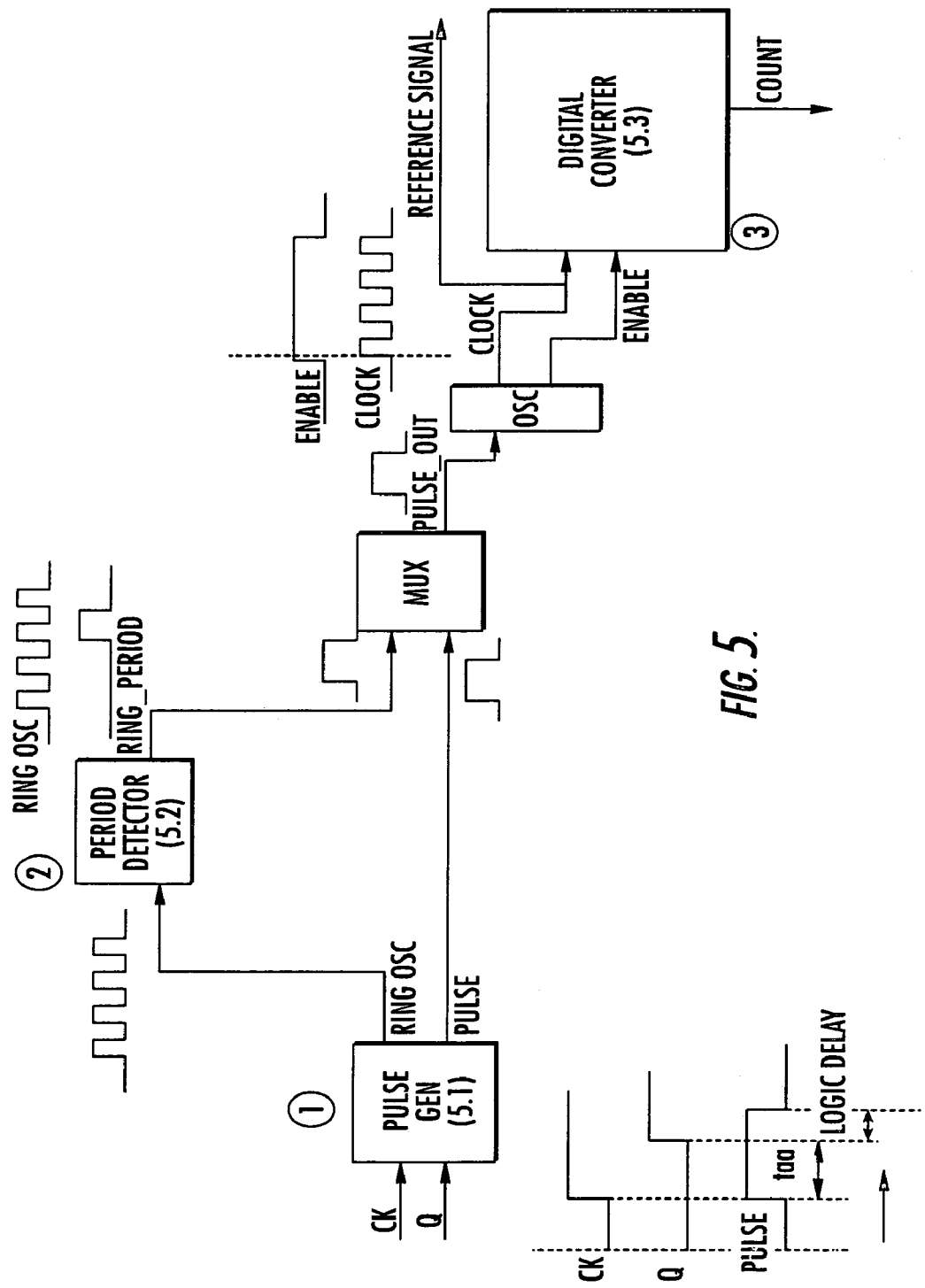
FIG. 5 is a schematic block diagram illustrating in greater detail the pulse-to-digital converter of the system of FIG. 2.

The block level implementation of the pulse-to-digital converter is illustratively shown in FIG. 5. The pulse-todigital converter illustratively includes a pulse generator 5.1, a period detector 5.2, and a digital converter 5.3. The pulse generator 5.1 extracts the difference between the transitions on the clock and Q pins of the memory. That is, it generates a pulse equivalent to the access time of the memory, plus an additional delay from the signal ck.

To extract the internal logic delay, the circuit is made to oscillate, which gives a frequency equivalent to the (1/(2·T logic), where Tlogic is the logic delay of the circuitry. The internal logic delay is inserted along with the access time measurement. The period of the frequency is 2·T logic, and to extract this period out of the oscillating frequency the period detector 5.2 is used. More particular, the period detector 5.2 is used to extract one period out of the oscillating clock signal.

The extracted period is converted into digital format by the digital converter 5.3, which also converts the data in pulse form into digital data. Normally this can be done with a high frequency clock. The digital data available after conversion can again be converted to time domain based upon the frequency of the clock used for the conversion. This block sends back a feedback signal to the FSM when the conversion is done. At the same time it also holds the converted data until it gets back the feedback signal from the FSM. The FSM generates the STORE signal which caused the converted data to be stored. Once the data is stored, the FSM is initialized for the next conversion.

Figure 6:
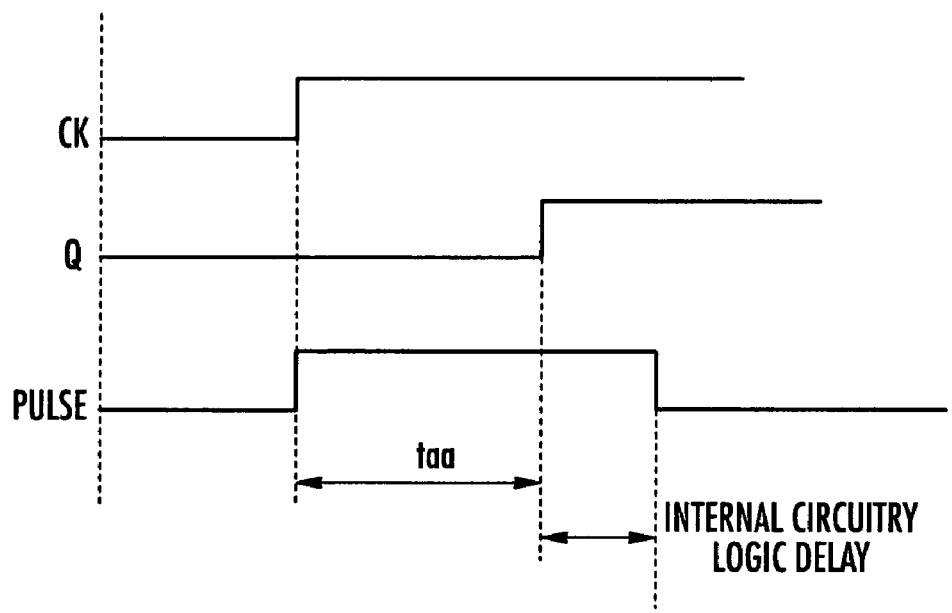
FIG. 6 is a waveform diagram illustrating simulated waveforms associated with the pulse generator of the pulse-to-digital converter of FIG. 5.
Figure 7:
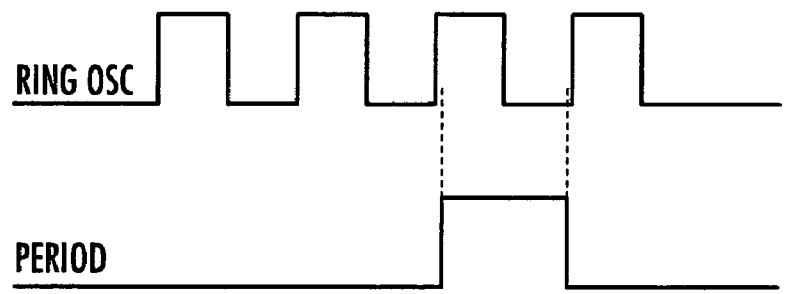
FIG. 7 is a waveform diagram illustrating simulated waveforms associated with the period detector of the pulse-to-digital converter of FIG. 5.
Figure 8:
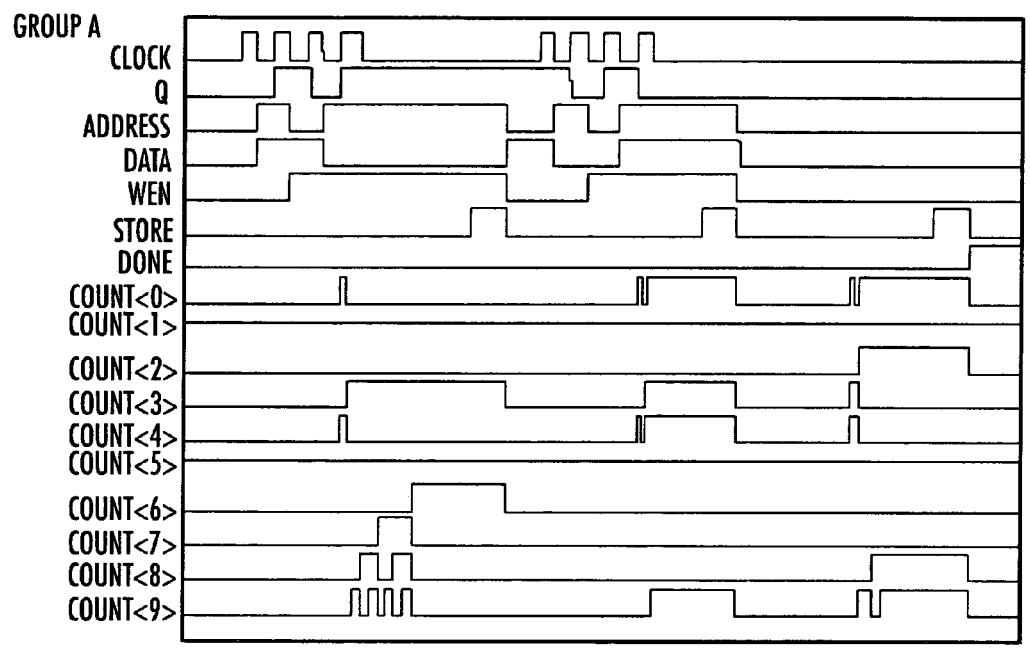
FIG. 8 is a waveform diagram illustrating simulated waveforms associated with the digital converter of the pulse-to-digital converter of FIG. 5.

The output of the pulse generator including the delay added by the internal circuitry is illustratively shown in FIG. 6. Further, the signal obtained by oscillating the pulse generation circuit to obtain its internal logic delay as a time period is shown in FIG. 7. Additionally, the set of waveforms corresponding to the measurement of memory access time including the timing signals for accessing the memory for read and write operations and the count values corresponding to the measured access time is illustratively shown in FIG. 8.

Figure 9:
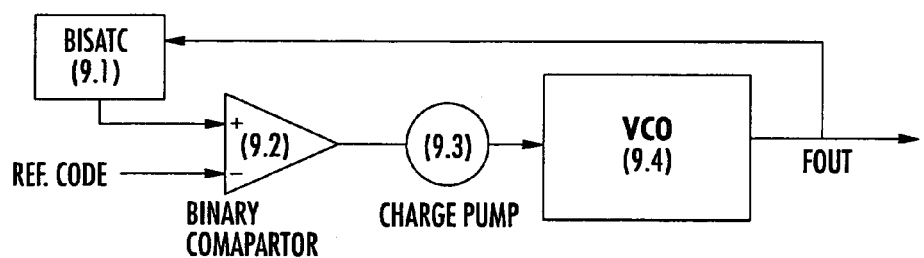
FIG. 9 is a schematic block diagram illustrating implementation of the present invention in a PLL.

Turning now additionally to FIG. 9, the application of the invention to a PLL is illustrative shown. The BISATC 9.1 converts the timing skew between a reference and the output of the voltage controller oscillator VCO 9.4 into a binary coded output for comparison by a binary comparator 9.2. The output of the binary comparator 9.2 controls a charge pump 9.3 for correcting the VCO 9.4 output.

Based on the foregoing, numerous advantages of the present invention will be appreciated by those of skill in the art. For example, no particular constraints are imposed on the test equipment, i.e., no special pattern is required. Further, an on-chip pattern generator for memory makes the access time characterization independent of the tester. In addition, accurate measurement of the impact of operating conditions (e.g., voltage, temperature, etc.) on access time may be made. Moreover, the time required for implementation of the BISATC circuit with the embedded device is reduced, and the BISATC circuit can measure small access times (e.g., a transition between two signals) as well as large access times with the relatively high accuracy.

That which is claimed is:

1. A system for determining a timing skew between first and second digital signals comprising:
   a clock generator for generating a timing clock signal;
   a digital converter for determining a signal delay between the first and second digital signals, said digital converter having an internal delay and generating an equivalent digital coded value based upon the signal delay, the timing clock signal, and the internal delay of said digital converter;
   a memory for storing the equivalent digital coded value; and
   a controller for controlling said digital converter based upon at least one measurement mode corresponding to values of the first and second digital signals, and for controlling the storage of the equivalent digital coded value in said memory.

2. The system of claim 1 wherein said digital converter comprises:
   a signal delay converter for converting the signal delay between the first and second digital signals into a pulse; and
   a counter for counting clock cycles of the timing clock signal based upon a duration of the pulse.

3. The system of claim 2 wherein said digital converter further comprises:
   a subtractor for subtracting from the counted clock cycles a number of cycles corresponding to the internal delay of said digital converter; and
   a digital code converter for converting the remaining counted clock cycles into the equivalent digital coded value.

4. The system of claim 3 wherein said digital converter is operable in an oscillator mode responsive to said controller; wherein said digital converter generates an internal delay pulse based upon a period of oscillation during the oscillation mode; and wherein said counter counts the number of cycles corresponding to the internal delay based upon the duration of the internal delay pulse.

5. The system of claim 1 wherein said controller comprises a finite state machine (FSM).

6. The system of claim 1 wherein the first and second digital signals respectively comprise a memory device access signal and a memory device output signal, and wherein the at least one measurement mode comprises at least one of a logic 1 read mode, a logic 0 read mode, a logic 1 write mode, and a logic 0 write mode.

7. The system of claim 1 wherein said controller generates the first and second digital signals.

8. The system of claim 1 wherein said memory comprises a register bank.

9. A system for determining a timing skew between first and second digital signals comprising:
   a clock generator for generating a timing clock signal;
   a digital converter for determining a signal delay between the first and second digital signals and generating an equivalent digital coded value based upon the signal delay and the timing clock signal; and
   a controller for controlling said digital converter based upon at least one measurement mode corresponding to values of the first and second digital signals and for controlling the storage of the equivalent digital coded value.

10. The system of claim 9 wherein said digital converter comprises:
    a signal delay converter for converting the signal delay between the first and second digital signals into a pulse; and
    a counter for counting clock cycles of the timing clock signal based upon a duration of the pulse.

11. The system of claim 10 wherein said digital converter further comprises:
    a subtractor for subtracting from the counted clock cycles a number of cycles corresponding to an internal delay of said digital converter; and a digital code converter for converting the remaining counted clock cycles into the equivalent digital coded value.

12. The system of claim 11 wherein said digital converter is operable in an oscillator mode responsive to said controller; wherein said digital converter generates an internal delay pulse based upon a period of oscillation during the oscillation mode; and wherein said counter counts the number of cycles corresponding to the internal delay based upon the duration of the internal delay pulse.

13. The system of claim 9 wherein said controller comprises a finite state machine (FSM).

14. The system of claim 9 wherein the first and second digital signals respectively comprise a memory device access signal and a memory device output signal, and wherein the at least one measurement mode comprises at least one of a logic 1 read mode, a logic 0 read mode, a logic 1 write mode, and a logic 0 write mode.

15. The system of claim 9 wherein said controller generates the first and second digital signals.

16. The system of claim 9 further comprising a memory for storing the digital coded values; and wherein said controller further controls the storage of the equivalent digital coded value in said memory.

17. A system for determining an access time for a memory device comprising:
a clock generator for generating a timing clock signal;
a digital converter for determining a signal delay between an access signal input to the memory device and an output signal output from the memory device, and for generating an equivalent digital coded value based upon the signal delay and the timing clock signal; and
a controller for controlling said digital converter based upon at least one measurement mode corresponding to values of the access signal and the output signal and for controlling the storage of the equivalent digital coded value.

18. The system of claim 17 wherein said digital converter comprises:
a first converter for converting the signal delay between the access and output signals into a pulse; and
a counter for counting clock cycles of the timing clock signal based upon a duration of the pulse.

19. The system of claim 18 wherein said digital converter further comprises:
a subtractor for subtracting from the counted clock cycles a number of cycles corresponding to an internal delay of said digital converter; and
a second converter for converting the remaining counted clock cycles into the equivalent digital coded value.

20. The system of claim 19 wherein said digital converter is operable in an oscillator mode responsive to said controller; wherein said digital converter generates an internal delay pulse based upon a period of oscillation during the oscillation mode; and wherein said counter counts the number of cycles corresponding to the internal delay based upon the duration of the internal delay pulse.

21. The system of claim 17 wherein said controller comprises a finite state machine (FSM).

22. The system of claim 17 wherein the at least one measurement mode comprises at least one of a logic 1 read mode, a logic 0 read mode, a logic 1 write mode, and a logic 0 write mode.

23. The system of claim 17 wherein the system is embedded within the memory device.

24. A phase locked loop (PLL) comprising:
a digital comparator for determining a timing skew between first and second digital signals comprising
a clock generator for generating a timing clock signal,
a digital converter for determining a signal delay between the first and second digital signals and generating an equivalent digital coded value based upon the signal delay and the timing clock signal, and
a controller for controlling said digital converter based upon at least one measurement mode corresponding to values of the first and second digital signals and for controlling the storage of the equivalent digital coded value.

25. The PLL of claim 24 wherein said digital converter comprises:
a first converter for converting the signal delay between the first and second digital signals into a pulse; and
a counter for counting clock cycles of the timing clock signal based upon a duration of the pulse.

26. The PLL of claim 25 wherein said digital converter further comprises:
a subtractor for subtracting from the counted clock cycles a number of cycles corresponding to an internal delay of said digital converter; and
a second converter for converting the remaining counted clock cycles into the equivalent digital coded value.

27. The PLL of claim 26 wherein said digital converter is operable in an oscillator mode responsive to said controller; wherein said digital converter generates an internal delay pulse based upon a period of oscillation during the oscillation mode; and wherein said counter counts the number of cycles corresponding to the internal delay based upon the duration of the internal delay pulse.

28. The PLL of claim 24 wherein said controller comprises a finite state machine (FSM).

29. A method for measuring a timing skew between first and second digital signals comprising:
generating a timing clock signal;
converting a signal delay between the first and second digital signals into a pulse;
counting cycles of the timing clock signal for a duration of the pulse;
determining a conversion delay associated with conversion of the signal delay to the pulse;
reducing the counted cycles by a value corresponding to the conversion delay to provide a corrected count value; and
converting the corrected count value into a digital coded value.

30. The method of claim 29 wherein the first and second digital signals respectively comprise an access signal for a memory and a signal output from the memory responsive to the access signal.

31. The method of claim 29 further comprising storing the digital coded value in a memory.

32. A method for determining timing skew between first and second digital signals comprising:
generating a timing clock signal;
determining a signal delay between the first and second digital signals and generating an equivalent digital coded value using a digital converter based upon the signal delay and the timing clock signal;

controlling the digital converter based upon at least one measurement mode corresponding to values of the first and second digital signals; and storing the equivalent digital coded value.

33. The method of claim 32 wherein generating the equivalent coded value comprises:
converting the signal delay between the first and second digital signals into a pulse; and
counting clock cycles of the timing clock signal based upon a duration of the pulse.

34. The method of claim 33 wherein generating the equivalent coded value further comprises:
subtracting from the counted clock cycles a number of cycles corresponding to an internal delay of the digital converter; and
converting the remaining counted clock cycles into the digital coded value.

35. The method of claim 34 wherein the digital converter is operable in an oscillator mode; and further comprising determining the internal delay by
operating the digital converter in the oscillator mode to generate an internal delay pulse and counting a number of cycles of the clock signal corresponding to the internal delay based upon the duration of the internal delay pulse.

36. The method of claim 32 wherein the first and second digital signals comprise a memory device access signal and a memory device output signal, and wherein the at least one measurement mode comprises at least one of a logic 1 read mode, a logic 0 read mode, a logic 1 write mode, and a logic 0 write mode.

* * * * *